United States Patent
Majhi et al.

(10) Patent No.: US 12,402,401 B2
(45) Date of Patent: Aug. 26, 2025

(54) INTEGRATED CIRCUIT DEVICES WITH FinFETS OVER GATE-ALL-AROUND TRANSISTORS

(71) Applicant: Intel Corporation, Santa Clara, CA (US)

(72) Inventors: Prashant Majhi, San Jose, CA (US); Brian S. Doyle, Portland, OR (US); Van H. Le, Beaverton, OR (US); Abhishek A. Sharma, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 832 days.

(21) Appl. No.: 17/477,891

(22) Filed: Sep. 17, 2021

(65) Prior Publication Data

US 2023/0086977 A1    Mar. 23, 2023

(51) Int. Cl.
*H01L 27/088*     (2006.01)
*H01L 21/02*      (2006.01)
(Continued)

(52) U.S. Cl.
CPC ....... *H10D 84/834* (2025.01); *H01L 21/0259* (2013.01); *H10B 12/31* (2023.02);
(Continued)

(58) Field of Classification Search
CPC .......... H01L 21/0259; H01L 21/02603; H01L 21/8221; H01L 21/823412;
(Continued)

(56) References Cited

U.S. PATENT DOCUMENTS

2016/0104705 A1*  4/2016  Chung ................. H01L 21/845
                                                                257/401
2018/0145143 A1    5/2018  Chen et al.
(Continued)

OTHER PUBLICATIONS

Chehab, Bilal, et al., "Design-Technology Co-Optimization of Sequential andMonolithic CFET as enabler of technology node beyond 2nm," Proc. SPIE 11614, Design-Process-Technology Co-optimization XV, Apr. 22, 2021; 6 pages.
(Continued)

*Primary Examiner* — David C Spalla
(74) *Attorney, Agent, or Firm* — Akona IP PC

(57) ABSTRACT

Described herein are integrated circuit (IC) devices that include devices that include fin-based field-effect transistors (FinFETs) integrated over gate-all-around (GAA) transistors. The GAA transistors may serve to provide high-performance compute logic, and may be relatively low-voltage transistors, while FinFETs may be more suitable than GAA transistors for providing high-voltage transistors, and, therefore, may serve to provide peripheral logic for backend memory arrays implemented over the same support structure over which the GAA transistors and the FinFETs are provided. Such an arrangement may address the fundamental voltage incompatibility by integrating a mix of FinFETs and GAA transistors in stacked complimentary FET (CFET) architecture to enable embedded 1T-1X based memories.

20 Claims, 9 Drawing Sheets

(51) Int. Cl.
*H01L 21/8234* (2006.01)
*H01L 27/108* (2006.01)
*H01L 29/06* (2006.01)
*H01L 29/423* (2006.01)
*H01L 29/66* (2006.01)
*H01L 29/78* (2006.01)
*H01L 29/786* (2006.01)
*H10B 12/00* (2023.01)
*H10D 30/01* (2025.01)
*H10D 30/62* (2025.01)
*H10D 30/67* (2025.01)
*H10D 62/10* (2025.01)
*H10D 84/01* (2025.01)
*H10D 84/03* (2025.01)
*H10D 84/83* (2025.01)

(52) U.S. Cl.
CPC ............ *H10B 12/36* (2023.02); *H10B 12/50* (2023.02); *H10D 30/024* (2025.01); *H10D 30/031* (2025.01); *H10D 30/62* (2025.01); *H10D 30/6735* (2025.01); *H10D 30/6757* (2025.01); *H10D 62/118* (2025.01); *H10D 84/0128* (2025.01); *H10D 84/0158* (2025.01); *H10D 84/038* (2025.01)

(58) Field of Classification Search
CPC ..... H01L 21/823431; H01L 21/823821; H01L 21/845; H01L 23/5383; H01L 27/0688; H01L 27/0886; H01L 27/0924; H01L 27/1211; H01L 29/0665; H01L 29/0669; H01L 29/0673; H01L 29/41791; H01L 29/42392; H01L 29/66439; H01L 29/66742; H01L 29/66795; H01L 29/775; H01L 29/785; H01L 29/7851; H01L 29/7853; H01L 29/7855; H01L 29/78696; H01L 2029/7858; H10B 12/31; H10B 12/36; H10B 12/50; H10D 30/014; H10D 30/024; H10D 30/031; H10D 30/62; H10D 30/6211; H10D 30/6212; H10D 30/6735; H10D 30/6757; H10D 62/118; H10D 62/119; H10D 62/121; H10D 84/0128; H10D 84/0158; H10D 84/0193; H10D 84/038; H10D 84/834; H10D 84/853

See application file for complete search history.

(56) References Cited

U.S. PATENT DOCUMENTS

| | | | |
|---|---|---|---|
| 2019/0326286 A1* | 10/2019 | Xie | H01L 29/401 |
| 2019/0393214 A1* | 12/2019 | Lilak | H01L 21/823431 |
| 2020/0006331 A1 | 1/2020 | Lilak et al. | |
| 2020/0343379 A1 | 10/2020 | Sharma et al. | |
| 2022/0037528 A1* | 2/2022 | Chuang | H01L 21/02532 |

OTHER PUBLICATIONS

James, Dick, "Intel Looks Ahead to Stacked Nano-Ribbon Transistors, Anti-Ferroelectric EDRAM at IEDM," Semiconductor-digest.com, Nov. 30, 2020; 8 pages.

* cited by examiner

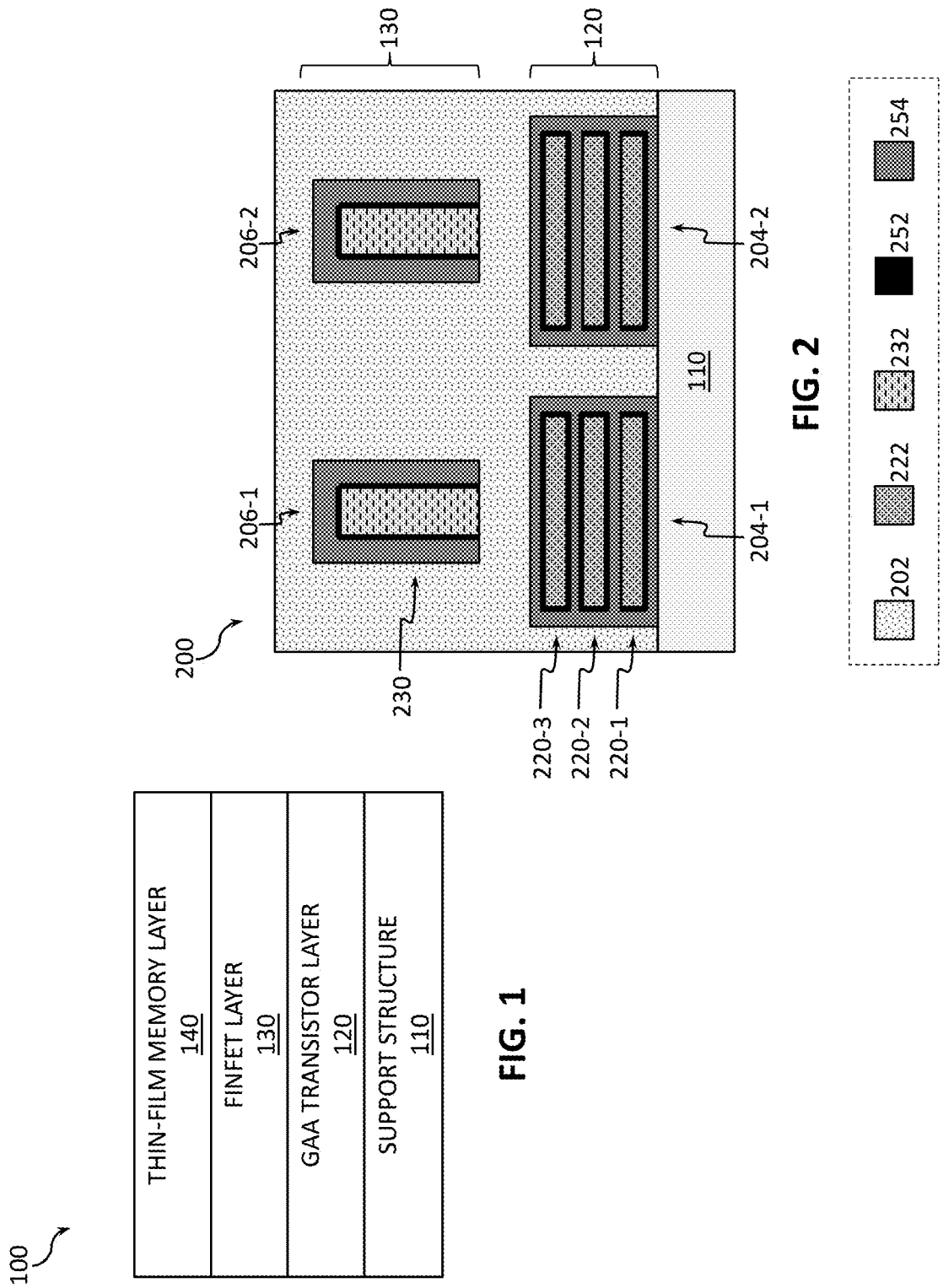

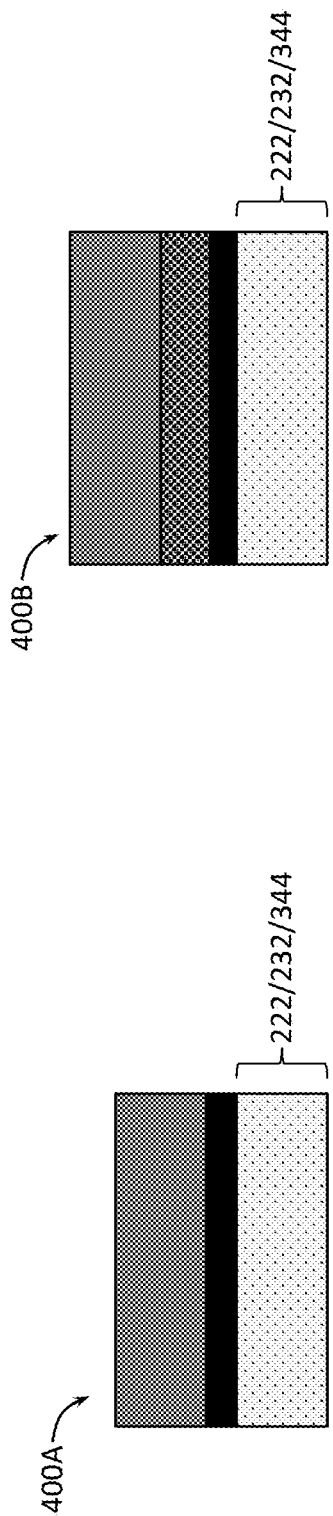
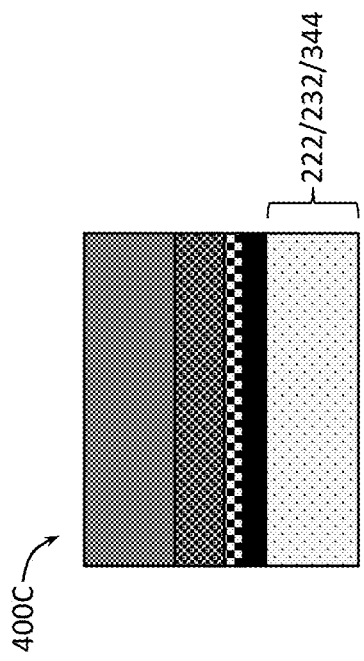
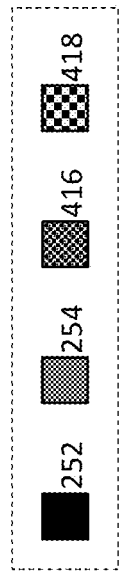
FIG. 4A
FIG. 4B
FIG. 4C

INTEGRATED CIRCUIT DEVICES WITH FinFETS OVER GATE-ALL-AROUND TRANSISTORS

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each IC die and each IC assembly or package that includes one or more dies becomes increasingly significant.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 1 is a schematic illustration of an IC device that includes fin-based field-effect transistors (FinFETs) integrated over gate-all-around (GAA) transistors, according to some embodiments of the present disclosure.

FIG. 2 is a cross-sectional side view of an example IC device with FinFETs integrated over GAA transistors, according to some embodiments of the present disclosure.

FIGS. 4A-4C are cross-sectional side views of gate stacks that could be used with any of the transistors of IC devices with FinFETs integrated over GAA transistors, according to some embodiments of the present disclosure.

DETAILED DESCRIPTION

Figure 3:
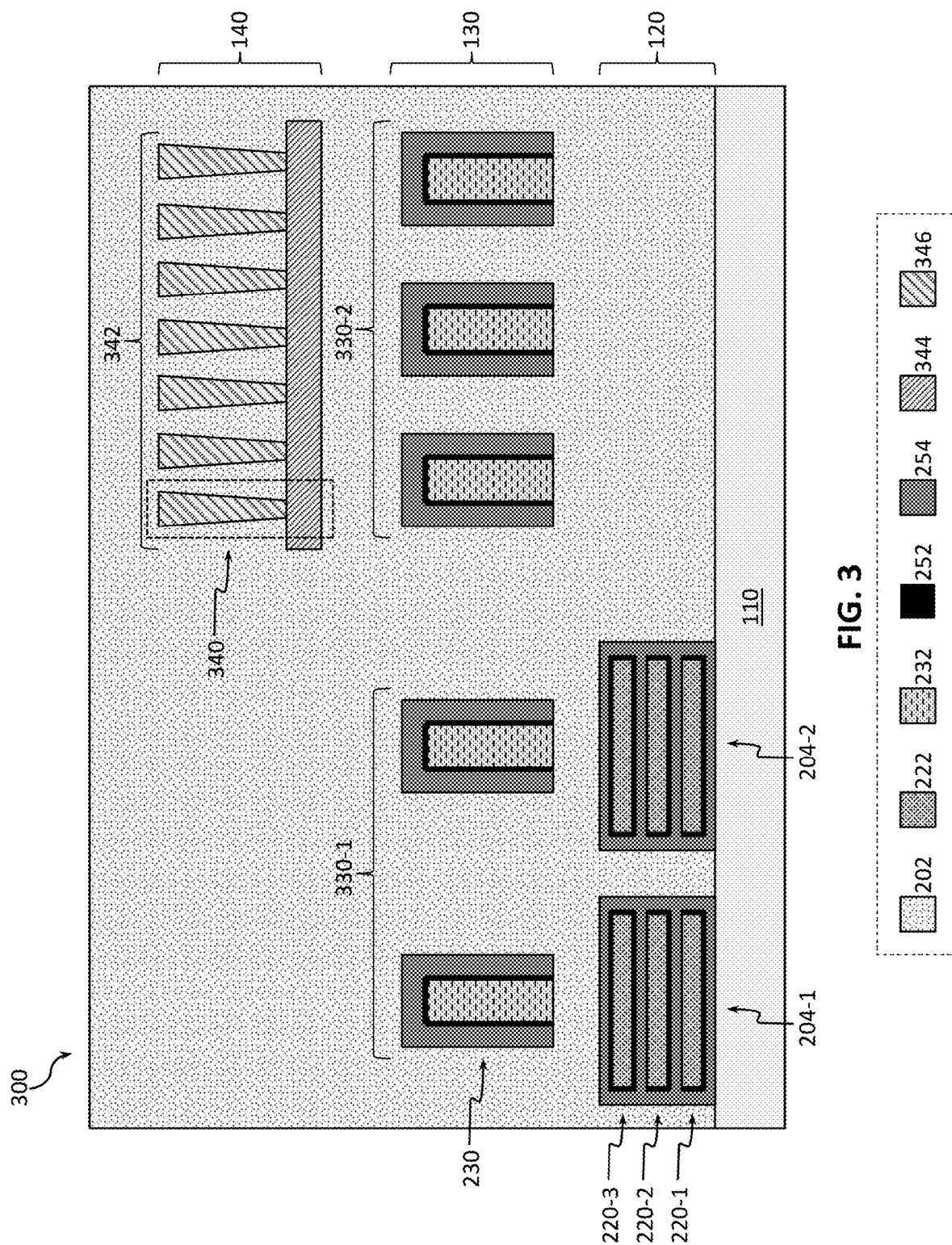
FIG. 3 is a cross-sectional side view of an example IC device with FinFETs and backend memory integrated over GAA transistors, according to some embodiments of the present disclosure.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating IC devices with FinFETs integrated over GAA transistors as described herein, it might be useful to first understand phenomena that may come into play in certain IC arrangements. The following foundational information may be viewed as a basis from which the present disclosure may be properly explained. Such information is offered for purposes of explanation only and, accordingly, should not be construed in any way to limit the broad scope of the present disclosure and its potential applications.

Some memory devices may be considered "standalone" devices in that they are included in a chip that does not also include compute logic (where, as used herein, the term "compute logic devices" or simply "compute logic" or "logic devices," refers to IC components, e.g., transistors, for performing computing/processing operations). Other memory devices may be included in a chip along with compute logic and may be referred to as "embedded" memory devices. Using embedded memory to support compute logic may improve performance by bringing the memory and the compute logic closer together and eliminating interfaces that increase latency. Various embodiments of the present disclosure relate to embedded memory arrays, as well as corresponding methods and devices.

Dynamic random-access memory (DRAM) and in particular, embedded DRAM (eDRAM), has been introduced in the past to address the limitation in density and standby power of other types or memory. As an example, a DRAM cell may include a capacitor for storing a bit value, or a memory state (e.g., logical "1" or "0") of the cell, and an access transistor controlling access to the cell (e.g., access to write information to the cell or access to read information from the cell). Such a memory cell may be referred to as a "1T-1C memory cell," highlighting the fact that it uses one transistor (i.e., "1T" in the term "1T-1C memory cell") and one capacitor (i.e., "1C" in the term "1T-1C memory cell"). The capacitor of a 1T-1C memory cell may be coupled to one S/D region of the access transistor (e.g., to the source region of the access transistor), while the other S/D region of the access transistor (e.g., to the drain region) may be coupled to a bit-line (BL), and a gate terminal of the transistor may be coupled to a word-line (WL). Since such a memory cell can be fabricated with as little as a single access transistor, it can provide higher density and lower standby power versus some other types of memory in the same process technology. Other types of memory may also involve access transistors such as the ones used in DRAM, but store bit values in other circuit components coupled to the access transistors. Therefore, such memory types are generally referred to as "1T-1X memory" to highlight the fact that an individual memory cell may use one transistor and one other circuit component (i.e., "1X" in the term "1T-1X memory"), such as a capacitor, a magnetic storage element, a resistor, or another transistor, coupled to the access transistor.

For future high-performance system-on-chip (SoC) architectures, there is an increasing desire for high bandwidth and high-density memory that is directly integrated on a single die with a processing unit (XPU), such as a computing processing unit (CPU) or a graphics processing unit (GPU). To this end, there has been research to embed DRAM in logic processes or to embed logic in DRAM-like processes. However, the advanced logic technology roadmap is driven by voltage scaling and adopts GAA transistor architecture for continued scaling, which is not always the most suitable for providing high-voltage transistors that may be needed for embedded DRAM.

Embodiments of the present disclosure relate to IC devices that include FinFETs integrated in a layer over GAA transistors, both provided over a single support structure (e.g., a substrate, a die, a wafer, or a chip). An example IC device may include a support structure (e.g., a substrate, a die, a wafer, or a chip); a first layer, comprising a plurality of GAA transistors; a second layer, comprising a plurality of FinFETs; and a third layer, comprising a memory array that includes a plurality of memory cells, where an individual cell of the plurality of memory cells includes a transistor with a channel region comprising a thin-film semiconductor material, where the first layer is between the support structure and the second layer (i.e., the second layer is further away from the support structure than the first layer), and the second layer is either at least partially overlaps with the third layer (i.e., the third layer may be located at approximately the same level with respect to the support structure as the second layer) or is between the first layer and the third layer (i.e., the third layer may be further away from the support structure). The GAA transistors may serve to provide high-performance compute logic, and may be relatively low-voltage transistors, while FinFETs may be more suitable than GAA transistors for providing high-voltage transistors, and, therefore, may serve to provide peripheral logic for backend memory arrays implemented over the same support structure over which the GAA transistors and the FinFETs are provided. Such an arrangement may address the fundamental voltage incompatibility by integrating a mix of FinFETs and GAA transistors in stacked complimentary FET (CFET) architecture to enable embedded 1T-1X based memories. Other technical effects will be evident from various embodiments described here.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. As used herein, a "logic state" (or, alternatively, a "state" or a "bit" value) of a memory cell may refer to one of a finite number of states that the cell can have, e.g., logic states "1" and "0," each state represented by a different charge, or a range of charges, stored in a storage node of the cell, while "READ" and "WRITE" memory access or operations refer to, respectively, determining/sensing a logic state of a memory cell and programming/setting a logic state of a memory cell.

Furthermore, some descriptions may refer to a particular source or drain region of a transistor being either a source region or a drain region. However, unless specified otherwise, which region of a transistor is considered to be a source region and which region is considered to be a drain region is not important because, as is common in the field of transistors, designations of source and drain are often interchangeable. Therefore, descriptions of some illustrative embodiments of the source and drain regions provided herein are applicable to embodiments where the designation of source and drain regions may be reversed. Unless explained otherwise, in some settings, the terms S/D region, S/D contact, and S/D terminal of a transistor may be used interchangeably, although, in general, the term "S/D contact" is used to refer to an electrically conductive structure for making a contact to a S/D region of a transistor, while the term "S/D terminal" may generally refer to either S/D region or S/D contact of a transistor.

A term "interconnect" may be used to describe any element formed of an electrically conductive material for providing electrical connectivity to one or more components associated with an IC or/and between various such components. In general, the term "interconnect" may refer to both conductive lines (or, simply, "lines," also sometimes referred to as "traces" or "trenches") and conductive vias (or, simply, "vias"). In general, in context of interconnects, the term "conductive line" may be used to describe an electrically conductive element isolated by an insulator material (e.g., a low-k dielectric material) that is provided within the plane of an IC die. Such lines are typically stacked into several levels, or several layers, of a metallization stack. On the other hand, the term "via" may be used to describe an electrically conductive element that interconnects two or more lines of different levels. To that end, a via may be provided substantially perpendicularly to the plane of an IC die and may interconnect two lines in adjacent levels or two lines in not adjacent levels. A term "metallization stack" may be used to refer to a stack of one or more interconnects for providing connectivity to different circuit components of an IC chip. Sometimes, lines and vias may be referred to as "metal traces" and "metal vias", respectively, to highlight the fact that these elements include electrically conductive materials such as metals.

Still further, the terms "package" and "IC package" are synonymous, as are the terms "die" and "IC die," the term "insulating" means "electrically insulating," the term "conducting" means "electrically conducting," unless otherwise specified. Although certain elements may be referred to in the singular herein, such elements may include multiple sub-elements. For example, "an electrically conductive material" may include one or more electrically conductive materials. If used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide. The terms "substantially," "close," "approximately," "near," and "about," generally refer to being within +/−20% of a target value (e.g., within +/−10% or within +/−5% of a target value) based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 4A-4C, such a collection may be referred to herein without the letters, e.g., as "FIG. 4." In order to not clutter the drawings, sometimes only one instance of a given element is labeled in a drawing with a reference numeral, although other similar elements may be shown.

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Furthermore, although a certain number of a given element may be illustrated in some of the drawings (e.g., a certain number and type of memory layers, a certain number and type of transistors of memory cells, or a certain arrangement of interconnects), this is simply for ease of illustration, and more, or less, than that number may be included in the IC devices and related assemblies and packages according to various embodiments of the present disclosure. Still further, various views shown in some of the drawings are intended to show relative arrangements of various elements therein. In other embodiments, various IC devices and related assemblies and packages, or portions thereof, may include other elements or components that are not illustrated (e.g., transistor portions, various further components that may be in electrical contact with any of the illustrated components of the IC devices and related assemblies and packages, etc.). Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., physical failure analysis (PFA) would allow determination of presence of one or more FinFETs integrated over GAA transistors as described herein.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC devices with FinFETs integrated over GAA transistors as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

FIG. 1 provides a schematic illustration of an example IC device (e.g., a chip) 100 in which FinFETs integrated over GAA transistors may be implemented, according to some embodiments of the present disclosure. As shown in FIG. 1, the IC device may include a support structure 110, a GAA transistor layer 120, and a FinFET layer 130. As shown in FIG. 1, the FinFET layer 130 may be integrated over the GAA transistor layer 120 so that the GAA transistor layer 120 is between the support structure 110 and the FinFET layer 130 (i.e., the FinFET layer 130 is stacked above the GAA transistor layer 120). In some embodiments, the IC device may further include a thin-film memory layer 140, integrated over the GAA transistor layer 120 so that the FinFET layer 130 is either at least partially overlaps with the thin-film memory layer 140 (i.e., the thin-film memory layer 140 may be located at approximately the same level with respect to the support structure 110 as the FinFET layer 130) or is between the GAA transistor layer 120 and the thin-film memory layer 140 (i.e., the thin-film memory layer 140 may be further away from the support structure 110 than the FinFET layer 130).

Figure 7:
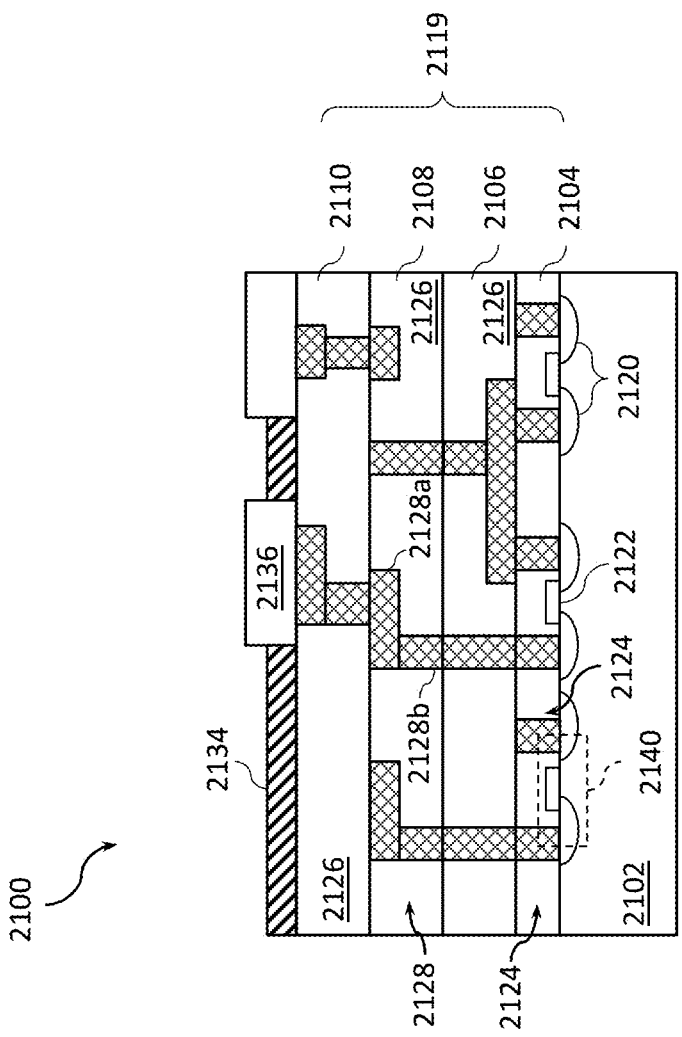
FIG. 7 is a cross-sectional side view of an IC device that may include one or more IC devices with FinFETs integrated over GAA transistors in accordance with any of the embodiments disclosed herein.

In general, the support structure 110 may include any of the materials described below with reference to the substrate 2102 (FIG. 7).

The GAA transistor layer 120 may be a layer in which a plurality of GAA transistors may be implemented and may be front end of line (FEOL) transistors such as the transistors 2140 (FIG. 7), fabricated so that channel regions of the transistors include substantially single-crystalline semiconductor material provided (e.g., epitaxially grown) as a top layer of the support structure 110. Because carrier mobility is the highest in single-crystalline semiconductor materials, such GAA transistors may be particularly suitable for providing high-performance compute logic of the IC device 100. For example, the GAA transistors of the GAA transistor layer 120 may be used to implement one or more of I/O circuitry, power delivery circuitry, a field programmable gate array logic, etc. In various embodiments, the GAA transistor layer 120 may include any combination of nanoribbon transistors, nanosheet transistors, and nanowire transistors.

The FinFET layer 130 may be a layer in which a plurality of FinFETs may be implemented. Because the FinFET layer 130 is stacked above the GAA transistor layer 120, channel regions of the FinFETs of the FinFET layer 130 may not be formed based on the substantially single-crystalline semiconductor material provided as a top layer of the support structure 110. In some embodiments, providing the FinFET layer 130 may include performing a layer transfer of a substantially single-crystalline semiconductor material grown (e.g., epitaxially grown) on another support structure to be over the GAA transistor layer 120, and then forming the FinFETs so that channel regions of the FinFETs of the FinFET layer 130 include the substantially single-crystalline semiconductor material that was transferred from another support structure. The architecture of FinFETs allows including thicker gate dielectrics in the gate stacks of the transistors compared to gate dielectrics that may be included in GAA transistors, which allows realizing relatively high-voltage transistors based on FinFETs ("high-voltage" compared to what can be realized with the GAA transistors). Furthermore, because the transistors of the FinFET layer 130 may be built based on a substantially single-crystalline semiconductor material, carrier mobility in these transistors may be comparable to that of the transistors of the GAA transistor layer 120, making the FinFETs of the FinFET layer 130 also relatively high-performance transistors. Because the transistors of the FinFET layer 130 may be made both relatively high-voltage and high-performance, they may be particularly suitable for providing peripheral logic for one or more memory arrays implemented in the thin-film memory layer 140.

The thin-film memory layer 140 may include a plurality of 1T-1X memory cells, where the transistors of the memory cells have channel regions formed of thin-film semiconductor materials, i.e., the transistors of the thin-film memory layer 140 may be thin-film transistors (TFTs). A TFT is a special kind of a field-effect transistor made by depositing a thin-film of a semiconductor material, as well as a dielectric layer and metallic contacts, over a support layer (or, simply, a "support") that may be a non-conducting and a non-semiconducting layer. In context of the IC device 100, such a thin-film of a semiconductor material may be deposited over the GAA transistor layer 120 and/or over the FinFET layer 130. At least a portion of the active thin-film semiconductor material forms a channel region of the TFT. Thin-film semiconductor materials are typically polycrystalline, polymorphous, or amorphous semiconductor materials, which is different from single-crystalline semiconductor materials that may be epitaxially grown on semiconductor substrates. TFTs are particularly suitable for being included in a back end of line (BEOL) portions of IC devices because thin-film channel materials may be deposited at relatively low temperatures, compared to the relatively high temperatures required for epitaxially growing single-crystalline semiconductor materials. Thus, TFTs are different from conventional, non-TFT, FEOL transistors where the active semiconductor material of the channel regions is typically a part of a semiconductor substrate, e.g., a part of a silicon wafer. FinFETs and TFT-based memory integrated over GAA transistors, described herein, may be used, for example, to address the scaling challenge of logic transistor (e.g., FEOL) based eDRAM technology and enable high-density embedded memory in an advanced complementary metal-oxide-semiconductor (CMOS) process.

Implementing transistors of 1T-1X memory cells as TFTs of the thin-film memory layer 140 may have the advantages of the reduced leakage and/or less expensive fabrication. On the other hand, implementing FinFETs of the FinFET layer 130 using layer transfer to provide substantially single-crystalline semiconductor channel materials over the GAA transistor layer 120 may have the advantages of faster operation of such transistors, due to carrier mobility being higher in single-crystalline semiconductor materials, compared to carrier mobility in polycrystalline, polymorphous, or amorphous semiconductor materials (i.e., in thin-film channel materials). In some embodiments, at least some of the FinFETs of the FinFET layer 130 (e.g., the relatively high-voltage FinFETs) may be coupled to one or more memory cells of the thin-film memory layer 140 and may be used to control access to data stored in the thin-film memory layer 140. On the other hand, the GAA transistors of the GAA transistor layer 120 being the high-performance compute logic transistors may be configured to perform various operations with respect to data accessed by the FinFETs of the FinFET layer 130 from the memory cells of the thin-film memory layer 140. Such operations may, e.g., include arithmetic and logic operations, pipelining of data from the FinFET layer 130 or the thin-film memory layer 140, pipelining of data from external devices/chips, etc. In contrast, in some embodiments, the FinFETs of the FinFET layer 130 may be configured to only control input/output (I/O) access to data stored in the thin-film memory layer 140 but not perform any operations on the data.

Whether a semiconductor channel material of a given transistor is a thin-film channel material or a single-crystalline semiconductor material may be identified by inspecting the grain size of the material. An average grain size of a semiconductor material in a channel region of a transistor being between about 0.05 and 1 millimeters (in which case the material may be considered to be polycrystalline) or smaller than about 0.05 millimeter (in which case the material may be considered to be polymorphous) may be indicative of the semiconductor material having been deposited at the relatively low temperatures (i.e., indicative of the transistor being a TFT). On the other hand, an average grain size of the semiconductor material being equal to or greater than about 1 millimeter (in which case the material may be considered to be a substantially single-crystalline material) may be indicative of the semiconductor material having been epitaxially grown (which, in general, is a process performed at substantially higher temperatures than those at which thin-film semiconductor materials may be deposited for TFTs). Presence of transistors with substantially single-crystalline semiconductor channel regions in the BEOL of an IC device (e.g., in the FinFET layer 130 of the IC device 100) may, therefore, be indicative of the layer transfer used to form such transistors.

For any of the TFTs described herein, a channel region may be composed of semiconductor material systems including, for example, N-type or P-type materials systems. In some embodiments, the channel region of a TFT may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the channel region of a TFT may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In particular, the channel region of a TFT may be a thin-film material. Some such materials may be deposited at relatively low temperatures, which allows depositing them within the thermal budgets imposed on back end fabrication to avoid damaging the frontend components (e.g., the GAA transistors of the GAA transistor layer 120). In some embodiments, the channel region of a TFT may have a thickness between about 5 and 75 nanometers, including all values and ranges therein.

For any of the transistors that are not TFTs described herein, a channel region may be composed of semiconductor material systems including, for example, N-type or P-type materials systems. In some embodiments, the channel region of a non-TFT may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel region of a non-TFT may include a combination of semiconductor materials. In some embodiments, the channel region of a non-TFT may include a monocrystalline semiconductor, such as silicon (Si) or germanium (Ge). In some embodiments, the channel region of a non-TFT may include a compound semiconductor with a first sub-lattice of at least one element from group III of the periodic table (e.g., Al, Ga, In), and a second sub-lattice of at least one element of group V of the periodic table (e.g., P, As, Sb). For some example N-type transistor embodiments (i.e., for the embodiments where the transistor is an N-type metal-oxide-semiconductor (NMOS) transistor), the channel region may advantageously include a III-V material having a high electron mobility, such as, but not limited to InGaAs, InP, InSb, and InAs. For some such embodiments, the channel region may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel region of a non-TFT may be an intrinsic III-V material, i.e., a III-V semiconductor material not intentionally doped with any electrically active impurity. In alternate embodiments, a nominal impurity dopant level may be present within the channel region, for example to further fine-tune a threshold voltage Vt of the transistor, to provide HALO pocket implants, etc. Even for impurity-doped embodiments however, impurity dopant level within the channel region may be relatively low, for example below $10^{15}$ dopant atoms per cubic centimeter ($cm^{-3}$), and advantageously below $10^{13}$ $cm^{-3}$. For some example P-type transistor embodiments (i.e., for the embodiments where the transistor is a P-type metal-oxide-semiconductor (PMOS) transistor), the channel region may advantageously be a group IV material having a high hole mobility, such as, but not limited to Ge or a Ge-rich SiGe alloy. For some example embodiments, the channel region may have a Ge content between 0.6 and 0.9, and advantageously may be at least 0.7. In some embodiments with highest mobility, the channel region may be intrinsic III-V (or IV for P-type devices) material and not intentionally doped with any electrically active impurity. In alternate embodiments, one or more a nominal impurity dopant level may be present within the channel region, for example to further set a threshold voltage (Vt), or to provide HALO pocket implants, etc. Even for impurity-doped embodiments however, impurity dopant level within the channel region is relatively low, for example below $10^{15}$ $cm^{-3}$, and advantageously below $10^{13}$ $cm^{-3}$.

Thin-film semiconductor materials typically have larger bandgaps and may, therefore, be less temperature sensitive, than epitaxially grown semiconductor materials. Therefore, in some embodiments, bandgaps of the semiconductor materials of the channel regions of the TFTs of the thin-film memory layer 140 may be larger than bandgaps of the semiconductor materials of the channel regions of the non-TFT transistors of the GAA transistor layer 120 and the FinFET layer 130.

FIG. 2 is a cross-sectional side view of an example IC device 200 with FinFETs integrated over GAA transistors, according to some embodiments of the present disclosure. The IC device 200 may be an example of the IC device 100, shown in FIG. 1. To that end, FIG. 2 illustrates some of the reference numerals used in the IC device 100 of FIG. 1. Descriptions of the elements with such reference numerals provided with respect to FIG. 1 are applicable to the IC device 200 of FIG. 2 and, in the interest of brevity, are not repeated. Furthermore, a number of elements that are labeled in FIG. 2, as well as in FIG. 3 and FIG. 4, with reference numerals are illustrated in these figures with different patterns, with a legend showing the correspondence between the reference numerals and patterns being provided at the bottom of these figures. For example, the legend illustrates that FIG. 2 uses different patterns to show an insulating material 202, a channel material 222 of the GAA transistor layer 120, a channel material 232 of the FinFET layer 130, etc.

As shown in FIG. 2, the GAA transistor layer 120 may include one or more stacks of GAA transistors provided over the support structure 110. Two such stacks are shown in FIG. 2 as stacks 204-1 and 204-2, each stack 204 including three GAA transistors 220 (labeled individually as transistors 220-1, 220-2, and 220-3) but, in other embodiments, the IC device 200 may include any number of one or more stacks 204, each stack 204 including any number of one or more GAA transistors 220, and different stacks 204 may include different number of the GAA transistors 220. The GAA transistors 220 may include a channel material 222, which may include any of the semiconductor materials described above with respect to channel regions of transistors that are not TFTs.

As further shown in FIG. 2, the FinFET layer 130 may include one or more fins based on which FinFETs may be formed, the FinFET layer 130 being further away from the support structure 110 than the GAA transistor layer 120. Two such fins are shown in FIG. 2 as fins 206-1 and 206-2, with FIG. 2 illustrating a FinFET 230 in each of the fins 206, but, in other embodiments, the IC device 200 may include any number of one or more fins 206, each fin 206 including any number of one or more FinFETs 230, and different fins 206 may include different number of the FinFETs 230. The FinFETs 230 may include a channel material 232, which may include any of the semiconductor materials described above with respect to channel regions of transistors that are not TFTs.

FIG. 2 further illustrates that a gate stack may at least partially wrap around a channel region of an individual GAA transistor 220 or a channel region of an individual FinFET 230, the gate stack including at least a gate dielectric material 252 and a gate electrode material 254, as shown in FIG. 2. Although FIG. 2 illustrates the same gate dielectric material 252 and the same gate electrode material 254 used in the GAA transistors 220 and in the FinFETs 230, in general, material compositions of the gate dielectric material 252 and the gate electrode material 254 in different ones of these transistors may be different. Various embodiments of the gate stacks that may be used with any of the GAA transistors 220, the FinFETs 230, as well as transistors of the thin-film memory layer 140 are described below with reference to FIGS. 4A-4C.

Although not specifically shown in FIG. 2, the IC device 200 further includes various interconnects for routing signals, power, and data between various components of the IC device 200. For example, such interconnects may couple one or more of the FinFETs 230 and one or more of the GAA transistors 220. In another example, such interconnects may couple any of the FinFETs 230 and any of the GAA transistors 220 to external components. In some embodiments, such interconnects may be implemented as described with reference to different metal layers of the metallization stack 2119, shown in FIG. 7. In various embodiments, various interconnects included in various embodiments of the IC device 100 may include any suitable electrically conductive material, alloy, or a stack of multiple electrically conductive materials. In some embodiments, various electrically conductive materials may include one or more metals or metal alloys, with metals such as copper, ruthenium, palladium, platinum, cobalt, nickel, hafnium, zirconium, titanium, tantalum, molybdenum, tungsten and aluminum. In some embodiments, various electrically conductive materials may include one or more electrically conductive alloys, oxides (e.g., conductive metal oxides), carbides (e.g., hafnium carbide, zirconium carbide, titanium carbide, tantalum carbide, and aluminum carbide), or nitrides (e.g., hafnium nitride, zirconium nitride, titanium nitride, tantalum nitride, and aluminum nitride) of one or more metals.

FIG. 2 further illustrates an insulating material 202 (e.g., an interlayer dielectric (ILD) material) that may surround various portions of the GAAs 220, the FinFETs 230, and various other components, including various interconnects, implemented in the IC device 200. In various embodiments, the insulating material 202 may include any suitable ILD materials such as silicon oxide, carbon-doped silicon oxide, silicon carbide, silicon nitride, aluminum oxide, and/or silicon oxynitride. In various embodiments, the insulating material 202 may include a low-k dielectric material. Examples of the low-k dielectric materials that may be used as the insulating material 202 include, but are not limited to, silicon dioxide, carbon-doped oxide, silicon nitride, fused silica glass (FSG), and organosilicates such as silsesquioxane, siloxane, and organosilicate glass. Other examples of low-k dielectric materials that may be used as the insulating material 202 include organic polymers such as polyimide, polynorbornenes, benzocyclobutene, perfluorocyclobutane, or polytetrafluoroethylene (PTFE). Still other examples of low-k dielectric materials that may be used as the insulating material 202 include silicon-based polymeric dielectrics such as hydrogen silsesquioxane (HSQ) and methylsilsesquioxane (MSQ). Other examples of low-k materials that may be used in the insulating material 202 include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1.

FIG. 3 is a cross-sectional side view of an example IC device 300 with FinFETs and backend memory integrated over GAA transistors, according to some embodiments of the present disclosure. The IC device 300 may be an example of the IC device 100, shown in FIG. 1. To that end, FIG. 3 illustrates some of the reference numerals used in the IC device 100 of FIG. 1. Furthermore, the IC device 300 may include the GAA transistors 220 and the FinFETs 230 as described with reference to FIG. 2, which can be seen by FIG. 3 illustrating some of the reference numerals used in the IC device 200 of FIG. 2. Descriptions of the elements with such reference numerals provided with respect to FIG. 1 and FIG. 2 are applicable to the IC device 300 of FIG. 3 and, in the interest of brevity, are not repeated.

As shown in FIG. 3, in some embodiments, in addition to the GAA transistors 220 and FinFETs 230 similar to those described with reference to FIG. 2, the IC device may further include a plurality of 1T-1X memory cells 340, forming a TFT-based memory array 342 in the thin-film memory layer 140. In particular, FIG. 3 illustrates a thin-film semiconductor material 344 based on which TFTs of the 1T-1X memory cells 340 may be formed. The thin-film semiconductor material 344 may include any of the semiconductor materials described above with respect to channel regions of TFTs. In addition, FIG. 3 illustrates capacitors 346, in case 1T-1X memory cells 340 are 1T-1C DRAM cells, however, in general, the memory cells 340 may include any type of storage elements besides the capacitors 346. Details of the TFTs of the 1T-1X memory cells 340 are not specifically shown in FIG. 3 because how TFT-based backend memory may be implemented may be different, depending on a particular design, and is generally known in the art.

FIG. 3 illustrates that, in some embodiments, the FinFETs 230 of the IC device 300 may be functionally divided into two groups 330. The first group 330-1 may include relatively low-voltage FinFETs 230, which may be coupled to various ones of the GAA transistors 220 to form desired logic circuits. For example, in some embodiments, the FinFETs 230 of the first group 330-1 may help the GAA transistors 220 (or, more generally, cooperate with the GAA transistors 220 in) providing high-performance compute logic functionality. The second group 330-2 may include relatively high-voltage FinFETs 230, which may be coupled to various ones of the backend TFT-based memory cells 340 to form desired memory circuits. For example, in some embodiments, the FinFETs 230 of the second group 330-2 may control read and write of data of the memory array 342. In such embodiments, a thickness of the gate dielectric 252 of the FinFETs 230 of the first group 330-1 may be smaller than a thickness of the gate dielectric 252 of the FinFETs 230 of the second group 330-2.

In various embodiments, any of the gate stacks of the GAA transistors 220, the FinFETs 230, or the TFTs of the 1T-1X memory cells 340 may be implemented in different manners. FIGS. 4A-4C are cross-sectional side views of gate stacks 400 that could be used with any of the transistors of IC devices with FinFETs integrated over GAA transistors, according to different embodiments of the present disclosure. Any of the gate stacks 400 shown in FIGS. 4A-4C may be used to implement any of the gate stacks of the GAA transistors 220, any of the gate stacks of the FinFETs 230, or any of the gate stacks of the TFTs of the 1T-1X memory cells 340.

A gate stack 400A, shown in FIG. 4A, illustrates an embodiment where any of the gate stacks of the transistors of the IC device 100 may include a stack of a gate electrode material 254 and a gate dielectric material 252, where the gate dielectric material 252 is between the gate electrode material 254 and the corresponding channel material 222/232/344. In some such embodiments, one side of the gate dielectric material 252 may be in contact with the channel material 222/232/344 while the opposite side of the gate dielectric material 252 may be in contact with the gate electrode material 254.

In various embodiments, the gate dielectric material 252 may include one or more high-k dielectric materials and may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric material 252 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric material 252 during manufacture of the transistors to improve the quality of the gate dielectric material 252. In some embodiments, the gate dielectric material 252 may have a thickness between about 0.5 nanometers and 3 nanometers, including all values and ranges therein, e.g., between about 1 and 3 nanometers, or between about 1 and 2 nanometers.

In some embodiments, the gate dielectric material 252 may be a multilayer gate dielectric, e.g., it may include any of the high-k dielectric materials in one layer and a layer of IGZO. In some embodiments, the gate stack (i.e., a combination of the gate dielectric material 252 and the gate electrode material 254) may be arranged so that the IGZO is disposed between the high-k dielectric and the channel material 222/232/344. In such embodiments, the IGZO may be in contact with the channel material 222/232/344, and may provide the interface between the channel material 222/232/344 and the remainder of the multilayer gate dielectric material 252. The IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10).

The gate dielectric material 252 may laterally surround the channel material 222/232/344, and the gate electrode material 254 may laterally surround the gate dielectric material 252 such that the gate dielectric material 252 is disposed between the gate electrode material 254 and the channel material 222/232/344.

The gate electrode material 254 may include at least one P-type work function metal or N-type work function metal, depending on whether a given transistor of the IC device 100 in which this gate electrode material 254 is implemented is a PMOS transistor or an NMOS transistor. For a PMOS transistor, metals that may be used for the gate electrode material 254 may include, but are not limited to, ruthenium, palladium, platinum, cobalt, nickel, and conductive metal oxides (e.g., ruthenium oxide). For an NMOS transistor, metals that may be used for the gate electrode material 254 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode material 254 may include a stack of two or more metal layers, where one or more metal layers are work function metal layers and at least one metal layer is a fill metal layer. Further metal layers may be included for other purposes, such as to act as a diffusion barrier layer.

A gate stack 400B, shown in FIG. 4B, illustrates an embodiment where any of the gate stacks of the GAA transistors 220, the FinFETs 230, or the TFTs of the 1T-1X memory cells 340 may include a stack of the gate electrode material 254, a ferroelectric (FE) or an antiferroelectric (AFE) material 416, and the gate dielectric material 252. In such embodiments, the gate dielectric material 252 is still between the gate electrode material 254 and the corresponding channel material 222/232/344, as in the gate stack 400A. More specifically, the gate dielectric material 252 may be between the FE/AFE material 416 and the corresponding channel material 222/232/344, and the FE/AFE material 416 may be between the gate dielectric material 252 and the gate electrode material 254. In some such embodiments, one side of the gate dielectric material 252 may be in contact with the channel material 222/232/344 while the opposite side of the gate dielectric material 252 may be in contact with the FE/AFE material 416. Similarly, one side of the FE/AFE material 416 may be in contact with the gate dielectric material 252 and the opposite side of the FE/AFE material 416 may be in contact with the gate electrode material 254.

As used herein, a FE or an AFE material is a material that exhibits, over some range of temperatures, spontaneous electric polarization, i.e., displacement of positive and negative charges from their original position, where the polarization can be reversed or reoriented by application of an electric field. In particular, an AFE material is a material that can assume a state in which electric dipoles from the ions and electrons in the material may form a substantially ordered (e.g., substantially crystalline) array, with adjacent dipoles being oriented in opposite (antiparallel) directions (i.e., the dipoles of each orientation may form interpenetrating sub-lattices, loosely analogous to a checkerboard pattern), while a FE material is a material that can assume a state in which all of the dipoles point in the same direction. Because the displacement of the charges in FE and AFE materials can be maintained for some time even in the absence of an electric field, such materials may be used to implement memory cells. The term "ferroelectric" is said to be adopted to convey the similarity of FE memories to ferromagnetic memories, despite the fact that there is typically no iron (Fe) present in FE materials. The term "FE transistor" may be used to refer to a transistor employing FE or AFE materials, e.g., in a gate stack as shown in FIG. 4B. Memory cells with FE transistors have the potential for adequate non-volatility, short programming time, low power consumption, high endurance, and high speed writing. In addition, FE transistors advantageously have the potential to be manufactured using processes compatible with the standard CMOS technology.

The FE/AFE material 416 may be provided between the gate electrode material 254 and the channel material 222/232/344. The FE/AFE material 416 may include one or more materials which exhibit sufficient FE or AFE behavior even at thin dimensions as typically used in scaled transistors as the ones illustrated here. In some embodiments, the FE/AFE material 416 may include a material including hafnium, zirconium, and oxygen (e.g., hafnium zirconium oxide (HZO)), possibly doped with one or more dopants such as silicon, germanium, aluminum, yttrium, lanthanum, gadolinium, or niobium. In some embodiments, the FE/AFE material 416 may include a material including hafnium and oxygen (e.g., hafnium oxide), doped with one or more dopants. For example, the FE/AFE material 416 may include one or more of a material including silicon, hafnium, and oxygen (e.g., silicon-doped hafnium oxide), a material including germanium, hafnium, and oxygen (e.g., germanium-doped hafnium oxide), a material including aluminum, hafnium, and oxygen (e.g., aluminum-doped hafnium oxide), a material including yttrium, hafnium, and oxygen (e.g., yttrium-doped hafnium oxide), a material including lanthanum, hafnium, and oxygen (e.g., lanthanum-doped hafnium oxide), a material including gadolinium, hafnium, and oxygen (e.g., gadolinium-doped hafnium oxide), and a material including niobium, hafnium, and oxygen (e.g., niobium-doped hafnium oxide). However, in other embodiments, any other materials which exhibit FE or AFE behavior at thin dimensions may be used as the FE/AFE material 416 and are within the scope of the present disclosure. A layer of the FE/AFE material 416 may be a thin-film material and may have a thickness between about 0.5 nanometers and 15 nanometers, including all values and ranges therein (e.g., between about 1 and 10 nanometers, or between about 0.5 and 5 nanometers).

A gate stack 400C, shown in FIG. 4C, illustrates an embodiment where any of the gate stacks of the GAA transistors 220, the FinFETs 230, or the TFTs of the 1T-1X memory cells 340 may include a stack of the gate electrode material 254, the FE/AFE material 416, an intermediate material 418, and the gate dielectric material 252. In such embodiments, the gate dielectric material 252 is still between the gate electrode material 254 and the corresponding channel material 222/232/344, as in the gate stacks 400A and 400B. More specifically, the gate dielectric material 252 may be between the intermediate material 418 and the corresponding channel material 222/232/344, the intermediate material 418 may be between the gate dielectric material 252 and the FE/AFE material 416, and the FE/AFE material 416 may be between the intermediate material 418 and the gate electrode material 254. In some such embodiments, one side of the gate dielectric material 252 may be in contact with the channel material 222/232/344 while the opposite side of the gate dielectric material 252 may be in contact with the intermediate material 418. Similarly, one side of the intermediate material 418 may be in contact with the gate dielectric material 252 and the opposite side of the intermediate material 418 may be in contact with the FE/AFE material 416. Furthermore, one side of the FE/AFE material 416 may be in contact with the intermediate material 418 and the opposite side of the FE/AFE material 416 may be in contact with the gate electrode material 254.

IC devices with FinFETs integrated over GAA transistors, as described herein, may be fabricated using any suitable techniques, e.g., subtractive, additive, damascene, dual-damascene, etc. Some of such technique may include suitable deposition and patterning techniques. As used herein, "patterning" may refer to forming a pattern in one or more materials using any suitable techniques (e.g., applying a resist, patterning the resist using lithography, and then etching the one or more material using dry etching, wet etching, or any appropriate technique).

Figure 5:
FIG. 5 is a flow diagram of a method of manufacturing an IC device with FinFETs integrated over GAA transistors, according to some embodiments of the present disclosure.

FIG. 5 is a flow diagram of a method 500 of manufacturing an IC device with FinFETs integrated over GAA transistors (e.g., any embodiments of the IC device 100, described herein), according to some embodiments of the present disclosure. The example fabrication method shown in FIG. 5 may include other operations not specifically shown in FIG. 5, such as various cleaning or planarization operations as known in the art. For example, in some embodiments, any of the layers of the IC device, or any of individual IC structures provided within the IC device, may be cleaned prior to, after, or during any of the processes of the fabrication method described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the top surfaces of the IC devices described herein may be planarized prior to, after, or during any of the processes of the fabrication method described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

As shown in FIG. 5, the fabrication method 500 may include a process 502, that includes providing a GAA transistor layer over a support structure. The GAA transistor layer provided in the process 502 may include any embodiments of the GAA transistor layer 120, described herein, and the support structure used in the process 502 may include any embodiments of the support structure 110, described herein. The method 500 may further include a process 504, that includes performing a layer transfer to provide a FinFET layer over the GAA transistor layer provided in the process 502. The FinFET layer provided in the process 504 may include any embodiments of the FinFET layer 130, described herein. In some embodiments, the layer transfer performed in the process 504 may include growing a layer of a semiconductor material, e.g., of a substantially single-crystalline semiconductor material, on a semiconductor substrate/wafer, e.g., using epitaxial growth, and then transferring the layer over the GAA transistor layer provided in the process 502. In some such embodiments, a bonding interface may be detectable between the GAA transistor layer provided in the process 502 and the semiconductor material transferred in the process 504. The method 500 may also include a process 506 in which thin-film memory may be provided as well. The thin-film memory provided in the process 506 may include any embodiments of the thin-film memory cells 340 or any embodiments of the thin-film memory layer 140, described herein.

Arrangements with FinFETs integrated over GAA transistors as disclosed herein may be included in any suitable electronic device. FIGS. 6-10 illustrate various examples of devices and components that may include one or more FinFETs integrated over GAA transistors as disclosed herein, e.g., that may include any embodiments of the IC devices 100, described herein.

Figures 6A, 6B:
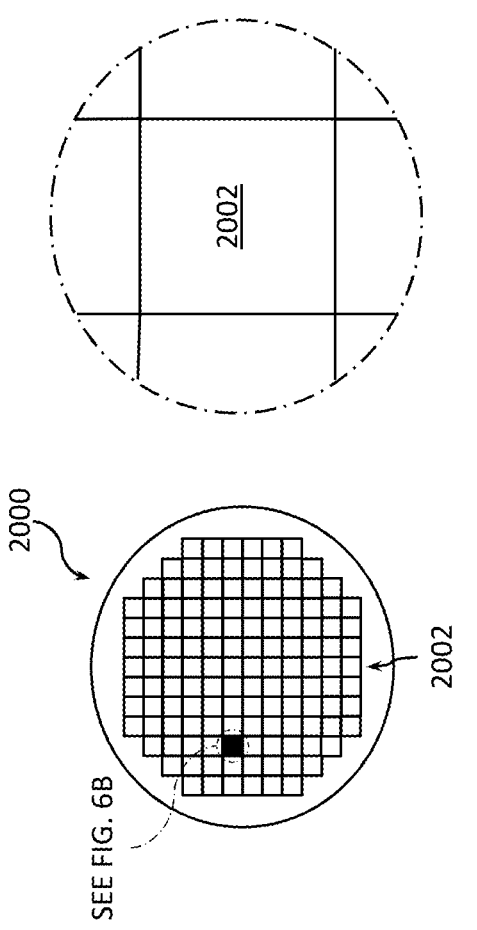
FIGS. 6A-6B are top views of a wafer and dies that may include one or more IC devices with FinFETs integrated over GAA transistors in accordance with any of the embodiments disclosed herein.

FIGS. 6A-6B are top views of a wafer 2000 and dies 2002 that may include one or more FinFETs integrated over GAA transistors (including FinFETs and TFT-based memory integrated over GAA transistors) in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 8. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more FinFETs integrated over GAA transistors, e.g., any embodiments of the IC devices 100, as described herein). After the fabrication of the semiconductor product is complete (e.g., after manufacture of one or more FinFETs integrated over GAA transistors as described herein), the wafer 2000 may undergo a singulation process in which each of the dies 2002 is separated from one another to provide discrete "chips" of the semiconductor product. In particular, devices that include one or more FinFETs integrated over GAA transistors as disclosed herein may take the form of the wafer 2000 (e.g., not singulated) or the form of the die 2002 (e.g., singulated). The die 2002 may include a plurality of transistors (e.g., GAA transistors 220, FinFETs 230, and, optionally, the TFTs of the thin-film memory layer 140) and/or supporting circuitry to route electrical signals to the transistors, as well as any other IC components. In some embodiments, the wafer 2000 or the die 2002 may implement or include a memory device (e.g., a static random-access memory (SRAM) device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 10) or other logic that is configured to store information in the memory devices or execute instructions stored in the memory array.

FIG. 7 is a cross-sectional side view of an IC device 2100 that may include one or more FinFETs integrated over GAA transistors (including FinFETs and TFT-based memory integrated over GAA transistors) in accordance with any of the embodiments disclosed herein. For example, the IC device 2100 may be, or may include, the IC device 100, described above, implementing one or more memory arrays which may include one or more FinFETs integrated over GAA transistors according to any embodiments described herein. In particular, different transistors of the one or more FinFETs integrated over GAA transistors as described herein may be implemented in any of the BEOL layers of the IC device 2100, e.g., in any of the interconnect layers 2106-2110 shown in FIG. 7. Because there are various possibilities where such FinFETs integrated over GAA transistors (including FinFETs and TFT-based memory integrated over GAA transistors) may be integrated in the IC device 2100, the FinFETs integrated over GAA transistors are not specifically shown in FIG. 7. In some embodiments, the IC device 2100 may serve as any of the dies 2256 in the IC package 2300.

As shown in FIG. 7, the IC device 2100 may be formed on a substrate 2102 (e.g., the wafer 2000 of FIG. 6A) and may be included in a die (e.g., the die 2002 of FIG. 6B). The substrate 2102 may include any material that may serve as a foundation for an IC device 2100, or, in general, as a foundation for forming one or more FinFETs integrated over GAA transistors according to any embodiments described herein. In some embodiments, the substrate 2102 may be a semiconductor substrate composed of semiconductor material systems including, for example, N-type or P-type material systems. The substrate may include, for example, a crystalline substrate formed using a bulk silicon or a silicon-on-insulator (SOI) structure. In some embodiments, the substrate 2102 may be formed using alternative materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. Further materials classified as group II-VI or group III-V may also be used to form the substrate 2102 on which logic devices, e.g., the GAA transistors 220 and/or the transistors 2140 as shown in FIG. 7, may be formed. In some embodiments, the substrate 2102 may be non-crystalline. In some embodiments, the substrate 2102 may be a printed circuit board (PCB) substrate. Although a few examples of the substrate 2102 are described here, any material or structure that may serve as a foundation upon which an IC device 2100 may be built falls within the spirit and scope of the present disclosure. The substrate 2102 may be part of a singulated die (e.g., the die 2002 of FIG. 6B) or a wafer (e.g., the wafer 2000 of FIG. 6A).

The IC device 2100 may include one or more device layers 2104 disposed on the substrate 2102. The device layer 2104 may include features of one or more transistors 2140 (e.g., metal-oxide-semiconductor field-effect transistors (MOSFETs)) formed on the substrate 2102. The device layer 2104 may include, for example, one or more S/D regions 2120, a gate 2122 to control current flow in the transistors 2140 between the S/D regions 2120, and one or more S/D contacts 2124 to route electrical signals to/from the S/D regions 2120. The transistors 2140 may include additional features not depicted for the sake of clarity, such as device isolation regions, gate contacts, and the like. In some embodiments, the transistors 2140 may include the GAA transistors 220 as described herein. In other embodiments, the transistors 2140 may be provided in addition to the GAA transistors 220 as described herein.

Each transistor 2140 may include a gate 2122 formed of at least two layers, a gate dielectric layer and a gate electrode layer. Generally, the gate dielectric layer of a transistor 2140 may include one layer or a stack of layers, and may include any of the materials described above with reference to the gate dielectric material 252. In some embodiments, an annealing process may be carried out on the gate dielectric of the gate 2122 to improve its quality when a high-k material is used.

The gate electrode may be formed on the gate dielectric and may include at least one P-type work function metal or N-type work function metal, depending on whether the transistor 2140 is to be a PMOS or an NMOS transistor. In some implementations, the gate electrode may include a stack of two or more metal layers, where one or more metal layers are work function metal layers and at least one metal layer is a fill metal layer. Further metal layers may be included for other purposes, such as a barrier layer. The gate electrode of the gate 2122 may include any of the materials described above with reference to the gate electrode material 254.

In some embodiments, when viewed as a cross-section of the transistor 2140 along the source-channel-drain direction, the gate electrode of the gate 2122 may include a U-shaped structure that includes a bottom or a top portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may include a combination of U-shaped structures and planar, non-U-shaped structures. For example, the gate electrode may include one or more U-shaped metal layers formed atop one or more planar, non-U-shaped layers. In some embodiments, the gate electrode may include a V-shaped structure (e.g., when the fin of a FinFET does not have a "flat" upper surface, but instead has a rounded peak).

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 2120 may be formed within the substrate 2102, e.g., adjacent to the gate of each transistor 2140. The S/D regions 2120 may be formed using an implantation/diffusion process or an etching/deposition process, for example.

Various transistors 2140 are not limited to the type and configuration depicted in FIG. 7 and may include a wide variety of other types and configurations such as, for example, planar transistors, non-planar transistors (e.g., FinFETs, nanowire, nanosheet, or nanoribbon transistors), or a combination of both.

Electrical signals, such as power and/or IO signals, may be routed to and/or from the transistors 2140 of the device layer 2104 through one or more interconnect layers disposed on the device layer 2104 (illustrated in FIG. 7 as interconnect layers 2106-2110). For example, electrically conductive features of the device layer 2104 (e.g., the gate 2122 and the S/D contacts 2124) may be electrically coupled with the interconnect structures 2128 of the interconnect layers 2106-2110. The one or more interconnect layers 2106-2110 may form an ILD stack 2119 of the IC device 2100.

The interconnect structures 2128 may be arranged within the interconnect layers 2106-1210 to route electrical signals according to a wide variety of designs (in particular, the arrangement is not limited to the particular configuration of interconnect structures 2128 depicted in FIG. 7). Although a particular number of interconnect layers 2106-1210 is depicted in FIG. 7, embodiments of the present disclosure include IC devices having more or fewer interconnect layers than depicted.

In some embodiments, the interconnect structures 2128 may include trench structures 2128A (sometimes referred to as "lines") and/or via structures 21283 (sometimes referred to as "holes") filled with an electrically conductive material such as a metal. The trench structures 2128A may be arranged to route electrical signals in a direction of a plane that is substantially parallel with a surface of the substrate 2102 upon which the device layer 2104 is formed. For example, the trench structures 2128A may route electrical signals in a direction in and out of the page from the perspective of FIG. 7. The via structures 21283 may be arranged to route electrical signals in a direction of a plane that is substantially perpendicular to the surface of the substrate 2102 upon which the device layer 2104 is formed. In some embodiments, the via structures 21283 may electrically couple trench structures 2128A of different interconnect layers 2106-2110 together.

The interconnect layers 2106-2110 may include a dielectric material 2126 disposed between the interconnect structures 2128, as shown in FIG. 7. In some embodiments, the dielectric material 2126 disposed between the interconnect structures 2128 in different ones of the interconnect layers 2106-2110 may have different compositions; in other embodiments, the composition of the dielectric material 2126 between different interconnect layers 2106-2110 may be the same. The dielectric material 2126 may include any of the materials described above with reference to the dielectric material 252.

A first interconnect layer 2106 (referred to as Metal 1 or "M1") may be formed directly on the device layer 2104. In some embodiments, the first interconnect layer 2106 may include trench structures 2128A and/or via structures 2128B, as shown. The trench structures 2128A of the first interconnect layer 2106 may be coupled with contacts (e.g., the S/D contacts 2124) of the device layer 2104.

A second interconnect layer 2108 (referred to as Metal 2 or "M2") may be formed directly on the first interconnect layer 2106. In some embodiments, the second interconnect layer 2108 may include via structures 2128B to couple the trench structures 2128A of the second interconnect layer 2108 with the trench structures 2128A of the first interconnect layer 2106. Although the trench structures 2128A and the via structures 2128B are structurally delineated with a line within each interconnect layer (e.g., within the second interconnect layer 2108) for the sake of clarity, the trench structures 2128A and the via structures 2128B may be structurally and/or materially contiguous (e.g., simultaneously filled during a dual-damascene process) in some embodiments.

A third interconnect layer 2110 (referred to as Metal 3 or "M3") (and additional interconnect layers, as desired) may be formed in succession on the second interconnect layer 2108 according to similar techniques and configurations described in connection with the second interconnect layer 2108 or the first interconnect layer 2106.

Although not specifically shown in FIG. 7, further metal layers may be present in the IC device 2100.

The IC device 2100 may include a solder resist material 2134 (e.g., polyimide or similar material) and one or more bond pads 2136 formed above the top interconnect layers of the IC device. The bond pads 2136 may be electrically coupled with the interconnect structures 2128 and configured to route the electrical signals of the transistor(s) 2140 to other external devices. For example, solder bonds may be formed on the one or more bond pads 2136 to mechanically and/or electrically couple a chip including the IC device 2100 with another component (e.g., a circuit board). The IC device 2100 may have other alternative configurations to route the electrical signals from the interconnect layers 2106-2110 than depicted in other embodiments. For example, the bond pads 2136 may be replaced by or may further include other analogous features (e.g., posts) that route the electrical signals to external components.

Figure 8:
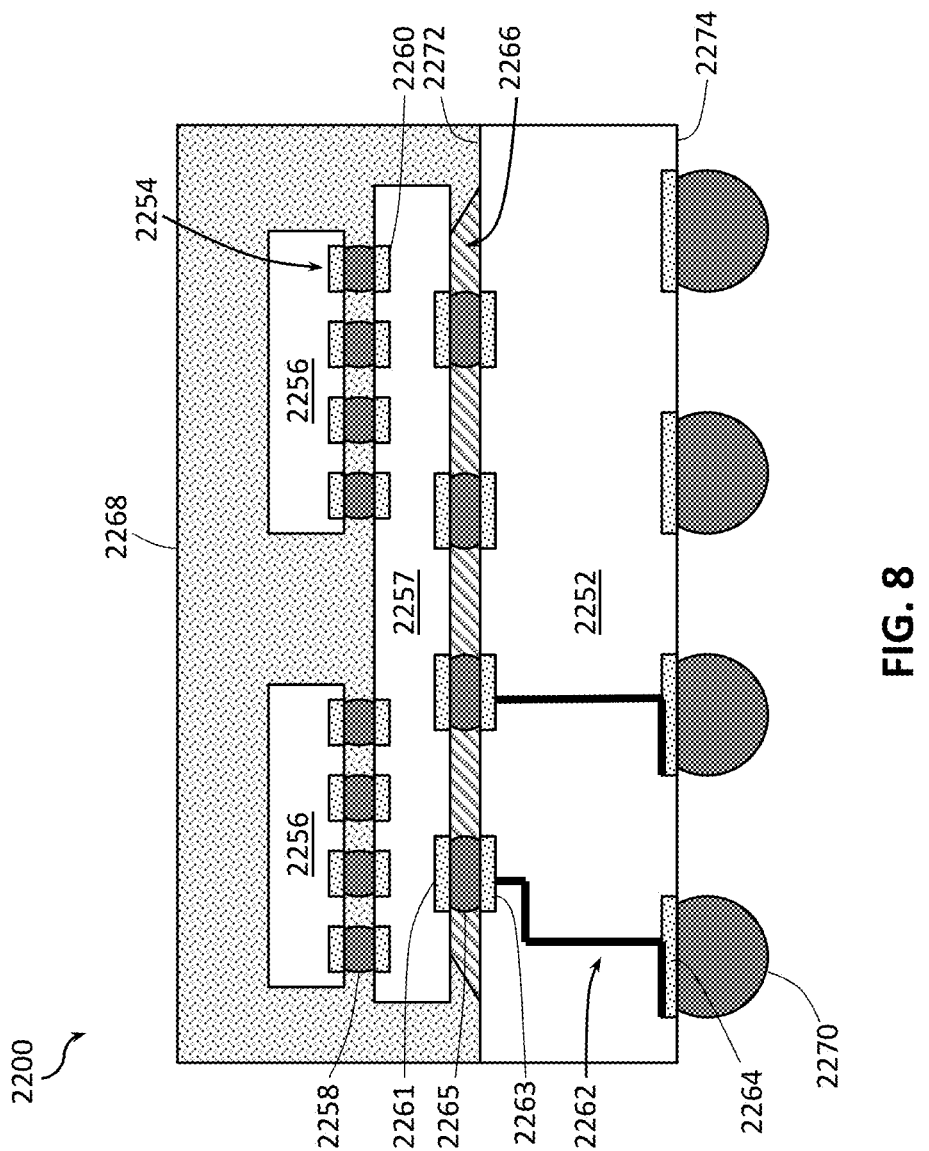
FIG. 8 is a cross-sectional side view of an IC package that may include one or more IC devices with FinFETs integrated over GAA transistors in accordance with any of the embodiments disclosed herein.

FIG. 8 is a side, cross-sectional view of an example IC package 2200 that may include one or more FinFETs integrated over GAA transistors (including FinFETs and TFT-based memory integrated over GAA transistors) in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274. These conductive pathways may take the form of any of the interconnect structures 2128 discussed above with reference to FIG. 7.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 8 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 8 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 8 are solder balls (e.g., for a ball grid array arrangement), but any suitable second-level interconnects 2270 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 9.

The dies 2256 may take the form of any of the embodiments of the die 2002 discussed herein (e.g., may include any of the embodiments of the IC device 100 as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high-bandwidth memory), including dies with the IC devices as described herein. In some embodiments, any of the dies 2256 may include one or more FinFETs integrated over GAA transistors, e.g., as discussed above; in some embodiments, at least some of the dies 2256 may not include any FinFETs integrated over GAA transistors.

The IC package 2200 illustrated in FIG. 8 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 8, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 9:
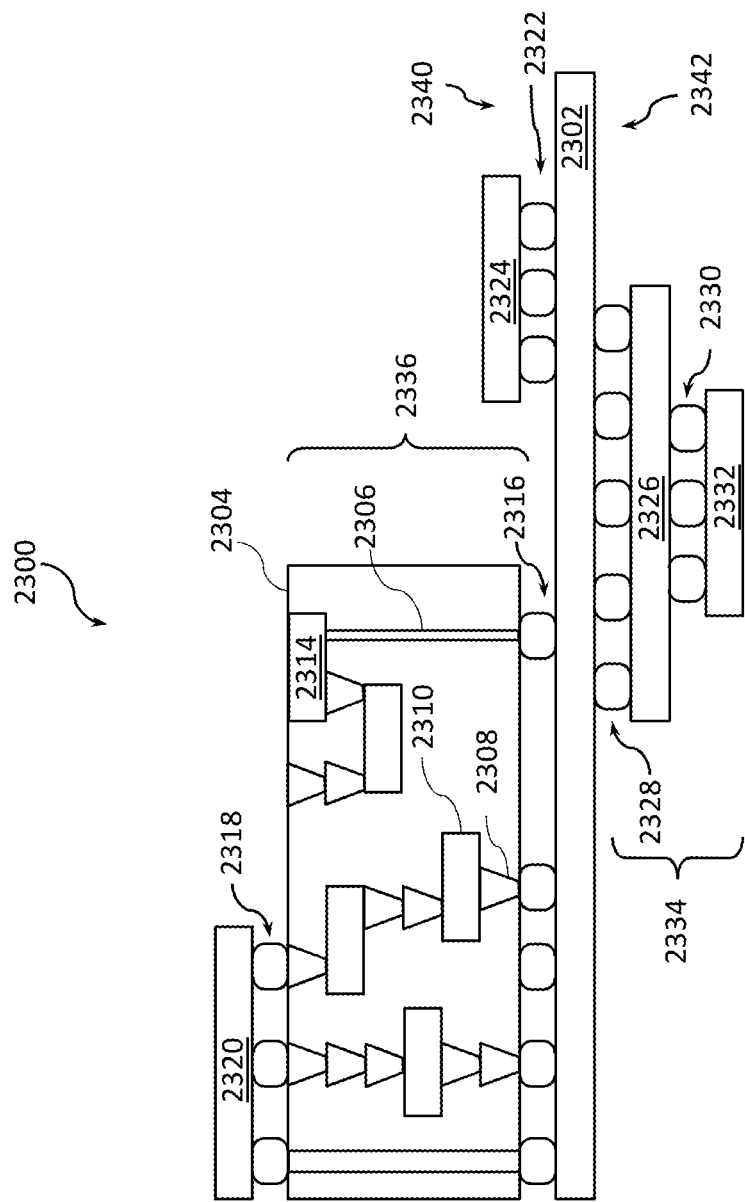
FIG. 9 is a cross-sectional side view of an IC device assembly that may include one or more IC devices with FinFETs integrated over GAA transistors in accordance with any of the embodiments disclosed herein.

FIG. 9 is a cross-sectional side view of an IC device assembly 2300 that may include components having one or more FinFETs integrated over GAA transistors (including FinFETs and TFT-based memory integrated over GAA transistors) in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more FinFETs integrated over GAA transistors in accordance with any of the embodiments disclosed herein; e.g., any of the IC packages discussed below with reference to the IC device assembly 2300 may take the form of any of the embodiments of the IC package 2200 discussed above with reference to FIG. 8 (e.g., may include one or more FinFETs integrated over GAA transistors provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 9 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 9), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 6B), an IC device (e.g., the IC device 100/300), or any other suitable component. In particular, the IC package 2320 may include one or more FinFETs integrated over GAA transistors (including FinFETs and TFT-based memory integrated over GAA transistors) as described herein. Although a single IC package 2320 is shown in FIG. 9, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 9, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 9 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 10:
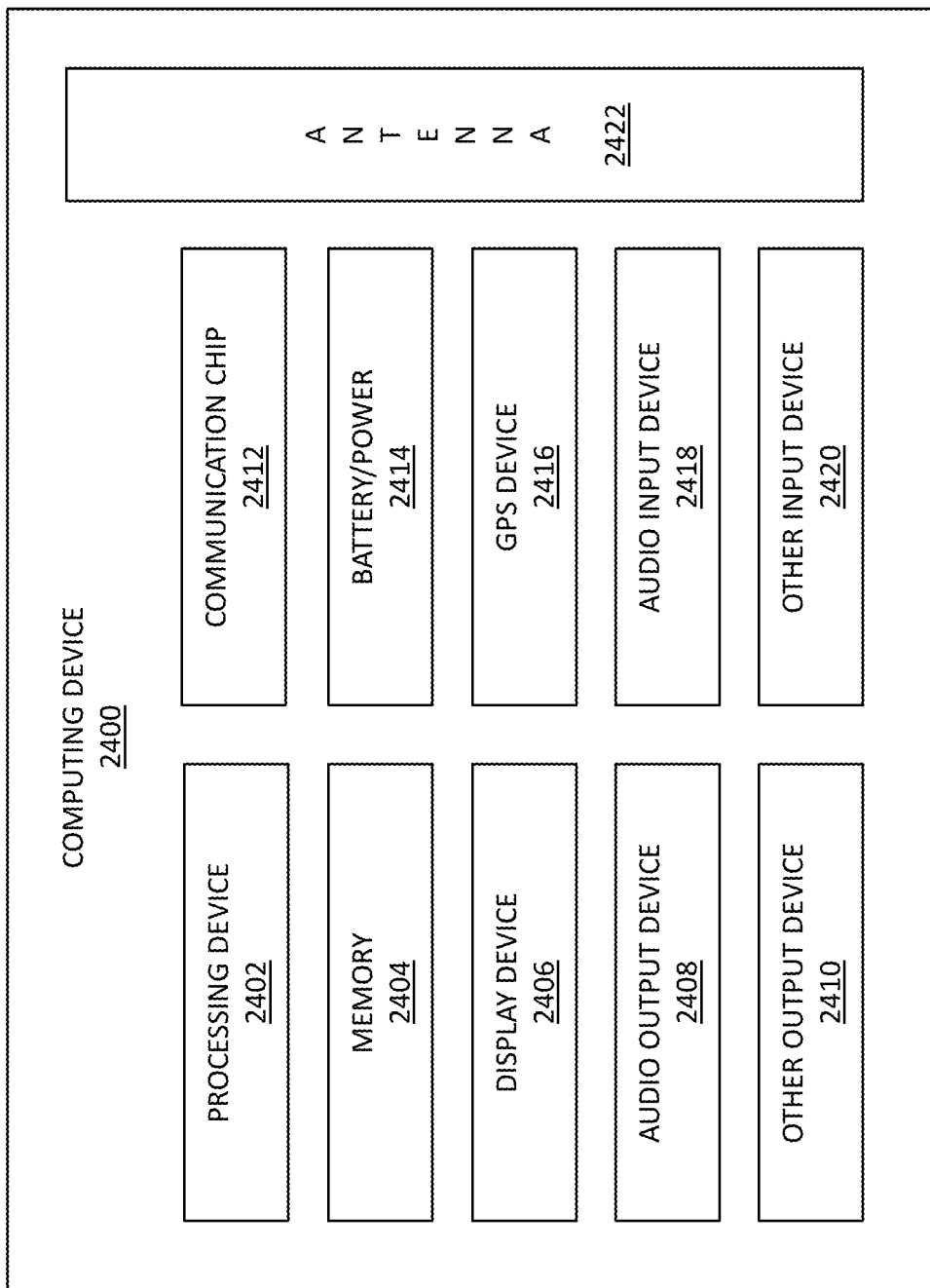
FIG. 10 is a block diagram of an example computing device that may include one or more IC devices with FinFETs integrated over GAA transistors in accordance with any of the embodiments disclosed herein.

FIG. 10 is a block diagram of an example computing device 2400 that may include one or more components with one or more FinFETs integrated over GAA transistors (including FinFETs and TFT-based memory integrated over GAA transistors) in accordance with any of the embodiments disclosed herein. For example, any suitable ones of the components of the computing device 2400 may include a die (e.g., the die 2002 of FIG. 6B) including one or more FinFETs integrated over GAA transistors in accordance with any of the embodiments disclosed herein. Any of the components of the computing device 2400 may include any embodiments of the IC device 100, the IC device 2100 of FIG. 7, any combination of these IC devices, and/or an IC package 2200 of FIG. 8. Any of the components of the computing device 2400 may include an IC device assembly 2300 of FIG. 9.

A number of components are illustrated in FIG. 10 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 10, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units, GPUs, cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include embedded memory, e.g., a memory with FinFETs and TFT-based memory integrated over GAA transistors as described herein.

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

The following paragraphs provide various examples of the embodiments disclosed herein.

Example 1 provides an IC device that includes a support structure (e.g., a substrate, a die, a wafer, or a chip); a first layer, including a plurality of GAA transistors; a second layer, including a plurality of FinFETs; and a third layer, including a memory array that includes a plurality of memory cells, where an individual cell of the plurality of memory cells includes a transistor with a channel region including a thin-film semiconductor material, where the first layer is between the support structure and the second layer (i.e., the second layer is further away from the support structure than the first layer), and the second layer is either at least partially overlaps with the third layer (i.e., the third layer may be located at approximately the same level with respect to the support structure as the second layer) or is between the first layer and the third layer (i.e., the third layer may be further away from the support structure).

Example 2 provides the IC device according to example 1, where the plurality of FinFETs includes a first group of FinFETs and a second group of FinFETs, an individual FinFET of the first group includes a gate dielectric of a first thickness, an individual FinFET of the first group includes a gate dielectric of a second thickness, and the second thickness is greater than the first thickness. Thus, the plurality of FinFETs may include relatively low-voltage transistors (the ones of the first group) as well as relatively high-voltage transistors (the ones of the second group).

Example 3 provides the IC device according to example 2, where one or more of the FinFETs of the first group are coupled to one or more of the GAA transistors. The relatively low-voltage FinFETs may be coupled to the GAA transistors to provide an XPU circuit over the support structure.

Example 4 provides the IC device according to examples 2 or 3, where one or more of the FinFETs of the second group are coupled to one or more of the memory cells. The relatively high-voltage FinFETs may be coupled to the memory cells to provide logic circuits for controlling operation of the backend memory implemented in the third layer.

Example 5 provides the IC device according to any one of the preceding examples, where an average grain size of the thin-film semiconductor material is smaller than about 0.1 millimeter, e.g., smaller than about 0.05 millimeter, which means that the thin-film semiconductor material may be polymorphous or polycrystalline, due to the relatively low-temperature deposition used to provide such a material in the backend layer of the IC device.

Example 6 provides the IC device according to any one of the preceding examples, where channel regions of the FinFETs include one or more semiconductor materials with an average grain size greater than about 1 millimeter, which means that the semiconductor materials used to form FinFETs are single-crystalline materials, and, therefore, also means that the semiconductor materials used to form the FinFETs must have been integrated in the IC device using layer transfer.

Example 7 provides the IC device according to any one of the preceding examples, where channel regions of the GAA transistors include one or more semiconductor materials with an average grain size greater than about 1 millimeter, which means that the semiconductor materials used to form the GAA transistors are single-crystalline.

Example 8 provides the IC device according to any one of the preceding examples, where the individual cell of the plurality of memory cells further includes a capacitor to store a bit value, the capacitor coupled to the transistor.

Example 9 provides the IC device according to any one of the preceding examples, where the GAA transistors include nanoribbon transistors.

Example 10 provides the IC device according to any one of the preceding examples, further including a bonding interface between the first layer and the second layer.

Example 11 provides an IC device that includes a support structure (e.g., a substrate, a die, a wafer, or a chip); a first layer, including a first plurality of transistors, the first plurality of transistors including nanoribbon transistors, nanosheet transistors, or both nanoribbon and nanosheet transistors; and a second layer, where channel regions of the second plurality of transistors includes one or more semiconductor materials with an average grain size greater than about 1 millimeter, where the first layer is between the support structure and the second layer (i.e., the second layer is further away from the support structure than the first layer).

Example 12 provides the IC device according to example 11, where channel regions of the first plurality of transistors includes one or more semiconductor materials with an average grain size greater than about 1 millimeter.

Example 13 provides the IC device according to examples 11 or 12, where the second plurality of transistors includes FinFETs.

Example 14 provides the IC device according to any one of examples 11-13, where the second plurality of transistors includes a first group of transistors and a second group of transistors, an individual transistor of the first group includes a gate dielectric of a first thickness, an individual transistor of the first group includes a gate dielectric of a second thickness, and the second thickness is greater than the first thickness. Thus, the second plurality of transistors may include relatively low-voltage transistors (the ones of the first group) as well as relatively high-voltage transistors (the ones of the second group).

Example 15 provides the IC device according to example 14, where one or more transistors of the first group are coupled to one or more transistors of the first plurality of transistors. The relatively low-voltage transistors may be coupled to the nanoribbon/nanosheet transistors to provide an XPU circuit over the support structure.

Example 16 provides the IC device according to examples 14 or 15, where the IC device further includes a plurality of memory cells, and one or more transistors of the second group are coupled to one or more memory cells of the plurality of memory cells. The relatively high-voltage transistors may be coupled to the memory cells.

Example 17 provides the IC device according to example 16, where the memory cells include one or more of DRAM cells, SRAM cells, magnetoresistive random-access memory (MRAM) cells, or resistive random-access memory (RRAM) cells.

Example 18 provides the IC device according to any one of examples 11-17, further including a bonding interface between the first layer and the second layer.

Example 19 provides an IC package that includes an IC device according to any one of the preceding examples; and a further IC component, coupled to the IC device.

Example 20 provides the IC package according to example 19, where the further IC component includes one of a package substrate, an interposer, or a further IC die.

In various further examples, the IC device according to any one of the preceding examples may include, or be a part of, at least one of a memory device, a computing device, a wearable device, a handheld electronic device, and a wireless communications device.

Example 21 provides an electronic device that includes a carrier substrate; and one or more of the IC device according to any one of the preceding examples and the IC package according to any one of the preceding examples, coupled to the carrier substrate.

Example 22 provides the electronic device according to example 21, where the carrier substrate is a motherboard.

Example 23 provides the electronic device according to example 21, where the carrier substrate is a PCB.

Example 24 provides the electronic device according to any one of examples 21-23, where the electronic device is a wearable electronic device (e.g., a smart watch) or handheld electronic device (e.g., a mobile phone).

Example 25 provides the electronic device according to any one of examples 21-24, where the electronic device further includes one or more communication chips and an antenna.

Example 26 provides the electronic device according to any one of examples 21-25, where the electronic device is an RF transceiver.

Example 27 provides the electronic device according to any one of examples 21-25, where the electronic device is one of a switch, a power amplifier, a low-noise amplifier, a filter, a filter bank, a duplexer, an upconverter, or a downconverter of an RF communications device, e.g., of an RF transceiver.

Example 28 provides the electronic device according to any one of examples 21-25, where the electronic device is a computing device.

Example 29 provides the electronic device according to any one of examples 21-28, where the electronic device is included in a base station of a wireless communication system.

Example 30 provides the electronic device according to any one of examples 21-28, where the electronic device is included in a user equipment device (i.e., a mobile device) of a wireless communication system.

Example 31 provides a method of fabricating an IC device. The method includes providing a first layer of transistors over a support structure, the first layer including a plurality of GAA transistors; performing a layer transfer to provide a second layer of transistors over the first layer, the second layer including a plurality of FinFETs; and providing a third layer over the second layer, the third layer including a plurality of memory cells, where an individual cell of the plurality of memory cells includes a transistor with a channel region comprising a thin-film semiconductor material.

Example 32 provides the method according to example 31, where the support structure is a first support structure, and where performing the layer transfer includes transferring a layer of a substantially single-crystalline semiconductor material grown on a second support structure to be over the first layer over the first support structure, and forming the FinFETs using portions of the substantially single-crystalline semiconductor material transferred to be over the first layer over the first support structure as channel regions of the FinFETs.

Example 33 provides the method according to examples 31 or 32, where the plurality of FinFETs includes a first group of FinFETs and a second group of FinFETs, and where the method further includes coupling one or more of the FinFETs of the first group to one or more of the GAA transistors, and coupling one or more of the FinFETs of the second group are coupled to one or more of the memory cells.

Example 34 provides the method according to any one of examples 31-33, where the GAA transistors include nanoribbon transistors or nanosheet transistors.

Example 35 provides the method according to any one of examples 31-34, further including processes for forming the IC device according to any one of the preceding examples (e.g., for forming the IC device according to any one of examples 1-18).

Example 36 provides the method according to any one of examples 31-35, further including processes for forming the IC package according to any one of the preceding examples (e.g., for forming the IC package according to any one of examples 19-20).

Example 37 provides the method according to any one of examples 31-36, further including processes for forming the electronic device according to any one of the preceding examples (e.g., for forming the electronic device according to any one of examples 21-30).

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
 a substrate;
 a first layer comprising a plurality of gate-all-around (GAA) transistors; and
 a second layer comprising a plurality of fin-based field-effect transistors (FinFETs),
 wherein:
  the first layer is between the substrate and the second layer, and
  a channel region of at least one transistor of the plurality of GAA transistors or the plurality of FinFETs includes one or more semiconductor materials with an average grain size greater than about 1 millimeter.

2. The IC device according to claim 1, wherein:
 the plurality of FinFETs includes a first group of FinFETs and a second group of FinFETs,
 an individual FinFET of the first group includes a gate dielectric of a first thickness,
 an individual FinFET of the first group includes a gate dielectric of a second thickness, and
 the second thickness is greater than the first thickness.

3. The IC device according to claim 2, wherein one or more of the FinFETs of the first group are coupled to one or more of the GAA transistors.

4. The IC device according to claim 1, wherein the GAA transistors include nanoribbon transistors.

5. The IC device according to claim 1, further comprising a bonding interface between the first layer and the second layer.

6. The IC device according to claim 1, further comprising:
 a third layer comprising a memory array that includes a plurality of memory cells, wherein an individual cell of the plurality of memory cells includes a transistor with a channel region comprising a thin-film semiconductor material,
 wherein:
  the second layer either at least partially overlaps with the third layer or is between the first layer and the third layer, and
  an average grain size of the thin-film semiconductor material is smaller than about 0.1 millimeter.

7. The IC device according to claim 6, wherein:
 the plurality of FinFETs includes a first group of FinFETs and a second group of FinFETs,
 an individual FinFET of the first group includes a gate dielectric of a first thickness,
 an individual FinFET of the first group includes a gate dielectric of a second thickness,
 the second thickness is greater than the first thickness, and
 one or more of the FinFETs of the second group are coupled to one or more of the memory cells.

8. The IC device according to claim 6, wherein the individual cell of the plurality of memory cells further includes a capacitor to store a bit value, the capacitor coupled to the transistor.

9. An integrated circuit (IC) device, comprising:
a substrate;
a first layer, comprising a first plurality of transistors, the first plurality of transistors including nanoribbon transistors, nanosheet transistors, or both nanoribbon and nanosheet transistors; and
a second layer comprising a second plurality of transistors, wherein channel regions of the second plurality of transistors includes one or more semiconductor materials with an average grain size greater than about 1 millimeter,
wherein the first layer is between the substrate and the second layer.

10. The IC device according to claim 9, wherein channel regions of the first plurality of transistors includes one or more semiconductor materials with an average grain size greater than about 1 millimeter.

11. The IC device according to claim 9, wherein the second plurality of transistors includes fin-based field-effect transistors (FinFETs).

12. The IC device according to claim 9, wherein:
the second plurality of transistors includes a first group of transistors and a second group of transistors,
an individual transistor of the first group includes a gate dielectric of a first thickness,
an individual transistor of the first group includes a gate dielectric of a second thickness, and
the second thickness is greater than the first thickness.

13. The IC device according to claim 12, wherein one or more transistors of the first group are coupled to one or more transistors of the first plurality of transistors.

14. The IC device according to claim 12, wherein the IC device further includes a plurality of memory cells, and one or more transistors of the second group are coupled to one or more memory cells of the plurality of memory cells.

15. The IC device according to claim 14, wherein the memory cells include one or more of dynamic random-access memory (DRAM) cells, static random-access memory (SRAM) cells, magnetoresistive random-access memory (MRAM) cells, or resistive random-access memory (RRAM) cells.

16. The IC device according to claim 9, further comprising a bonding interface between the first layer and the second layer.

17. An integrated circuit (IC) device, comprising:
a substrate;
a first layer comprising a first plurality of transistors;
a second layer comprising a second plurality of transistors; and
a third layer comprising a memory array that includes a plurality of memory cells, wherein the memory array includes a third plurality of transistors, wherein a channel region of at least one transistor of the third plurality of transistors includes one or more semiconductor materials with an average grain size smaller than about 0.1 millimeter.

18. The IC device according to claim 17, wherein:
the first layer is between the substrate and the second layer, and
the second layer either at least partially overlaps with the third layer or is between the first layer and the third layer.

19. The IC device according to claim 17, wherein:
a channel region of at least one transistor of the first plurality of transistors or at least one transistor of the second plurality of transistors includes one or more semiconductor materials with an average grain size greater than about 1 millimeter.

20. The IC device according to claim 19, wherein:
the first plurality of transistors include gate-all-around (GAA) transistors, and
the second plurality of transistors include fin-based field-effect transistors (FinFETs).

* * * * *